(12) United States Patent
Bhatia et al.

(10) Patent No.: US 9,935,659 B2
(45) Date of Patent: Apr. 3, 2018

(54) PERFORMANCE OPTIMIZATION IN SOFT DECODING FOR TURBO PRODUCT CODES

(71) Applicant: SK hynix Inc., Gyeonggi-do (KR)

(72) Inventors: Aman Bhatia, San Jose, CA (US);
Naveen Kumar, San Jose, CA (US);
Yi-Min Lin, San Jose, CA (US);
Lingqi Zeng, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/158,416

(22) Filed: May 18, 2016

(65) Prior Publication Data

US 2016/0344426 A1 Nov. 24, 2016

Related U.S. Application Data

(60) Provisional application No. 62/163,288, filed on May 18, 2015.

(51) Int. Cl.
*H03M 13/00* (2006.01)
*H03M 13/29* (2006.01)
*H03M 13/45* (2006.01)

(52) U.S. Cl.
CPC ... *H03M 13/2963* (2013.01); *H03M 13/2927* (2013.01); *H03M 13/2948* (2013.01); *H03M 13/453* (2013.01)

(58) Field of Classification Search
None
See application file for complete search history.

(56) References Cited

U.S. PATENT DOCUMENTS

| | | | | |
|---|---|---|---|---|
| 6,134,694 A | * | 10/2000 | Uebayashi | H03M 13/09 714/751 |
| 6,526,538 B1 | * | 2/2003 | Hewitt | H03M 13/2918 375/262 |
| 7,039,846 B2 | * | 5/2006 | Hewitt | H04L 25/067 714/755 |
| 7,356,752 B2 | * | 4/2008 | Hewitt | H03M 13/2903 714/755 |
| 8,255,758 B2 | * | 8/2012 | Anholt | G06F 11/1008 714/752 |
| 8,674,860 B2 | * | 3/2014 | Wu | H03M 13/1515 341/107 |
| 9,053,047 B2 | * | 6/2015 | Sommer | G06F 11/1012 |
| 9,214,965 B2 | | 12/2015 | Fitzpatrick et al. | |

(Continued)

*Primary Examiner* — Daniel McMahon
(74) *Attorney, Agent, or Firm* — IP & T Group LLP

(57) ABSTRACT

Systems for performing turbo product code decoding includes an error intersection identifier determining a set of one or more error intersections using a set of error-containing codewords, and updating, based at least in part on Chase decoding performed on the set of error-containing codewords, the set of error intersections to obtain an updated set of one or more error intersections, a bit location selector suitable for selecting, from the set of error intersections, a set of one or more least reliable bit locations using soft information associated with the set of error-containing codewords, and a Chase decoder performing Chase decoding on the set of error-containing codewords based on a first value being a number of least reliable bit locations and a second value being a maximum number of allowable flips allowed out of the number of least reliable bit locations.

18 Claims, 19 Drawing Sheets

(56) References Cited

U.S. PATENT DOCUMENTS

| | | | |
|---|---|---|---|
| 9,231,623 B1* | 1/2016 | Kumar | H03M 13/2963 |
| 2004/0019842 A1* | 1/2004 | Argon | H03M 13/29 |
| | | | 714/755 |
| 2014/0129899 A1 | 5/2014 | Kumar et al. | |
| 2014/0351672 A1* | 11/2014 | Marrow | H03M 13/152 |
| | | | 714/764 |
| 2015/0149873 A1 | 5/2015 | Cai et al. | |

* cited by examiner

← 1100

| Step | Processing |
|---|---|
| 1 | Hard TPC Decoding |
| 2 | Estimate Error Intersections (2 codes) |
| 3 | Chase Decoding using Error Intersections |
| 4 | Repeat Hard TPC Decoding |

FIG. 11

PERFORMANCE OPTIMIZATION IN SOFT DECODING FOR TURBO PRODUCT CODES

CROSS-REFERENCE TO RELATED APPLICATIONS

This application claims the benefit of U.S. Provisional Application No. 62/163,288 filed May 18, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

Turbo-product codes (TPC) are a type of error correction codes. During TPC encoding, payload information is arranged in a matrix, and a TPC encoder encodes the rows and columns using component codes. For example, the rows are grouped in some manner (e.g., each group is 1-bit "high") and encoded. Then, the columns are grouped in some manner (e.g., each group is 1-bit "wide") and encoded. On the decoder side, this process is reversed. Sometimes, a TPC decoder encounters a stuck error pattern. For example, a TPC codeword being corrected may come to a steady state where the TPC decoder is unable to remove the final errors in the TPC codeword being corrected. Or, the TPC codeword oscillates back and forth between two error states (e.g., having a different number of errors and/or different error locations). New TPC decoding techniques which help when a stuck error pattern is encountered would be desirable.

SUMMARY

Aspects of the invention include systems for performing turbo product code decoding. The systems may include an error intersection identifier suitable for determining a set of one or more error intersections using a set of error-containing codewords, and updating, based at least in part on Chase decoding performed on the set of error-containing codewords, the set of error intersections to obtain an updated set of one or more error intersections, a bit location selector suitable for selecting, from the set of error intersections, a set of one or more least reliable bit locations using soft information associated with the set of error-containing codewords, and a Chase decoder suitable for performing Chase decoding on the set of error-containing codewords based on a first value being a number of least reliable bit locations and a second value being a maximum number of allowable flips allowed out of the number of least reliable bit locations.

Further aspects of the invention include methods for performing turbo product code decoding. The methods may include determining, with an error intersection identifier, a set of one or more error intersections using a set of error-containing codewords, updating, with the error intersection identifier, the set of error intersections based at least in part on Chase decoding performed on the set of error-containing codewords to obtain an updated set of one or more error intersections, selecting, with a bit location selector, from the set of error intersections, a set of one or more least reliable bit locations using soft information associated with the set of error-containing codewords, and performing Chase decoding, with a Chase decoder, on the set of error-containing codewords based on a first value being a number of least reliable bit locations and a second value being a maximum number of allowable flips allowed out of the number of least reliable bit locations.

Additional aspects of the invention include memory devices for performing turbo product code decoding. The memory devices may include an error intersection identifier configured to determine a set of one or more error intersections using a set of error-containing codewords and update, based at least in part on Chase decoding performed on the set of error-containing codewords, the set of error intersections to obtain an updated set of one or more error intersections, a bit location selector configured to select, from the set of error intersections, a set of one or more least reliable bit locations using soft information associated with the set of error-containing codewords, and a Chase decoder configured to perform Chase decoding on the set of error-containing codewords based on a first value being a number of least reliable bit locations and a second value being a maximum number of allowable flips allowed out of the number of least reliable bit locations.

BRIEF DESCRIPTION OF THE DRAWINGS

FIG. 11 is a diagram illustrating a TPC decoding plan which includes Chase decoding using error intersections.

DETAILED DESCRIPTION

Figure 1:
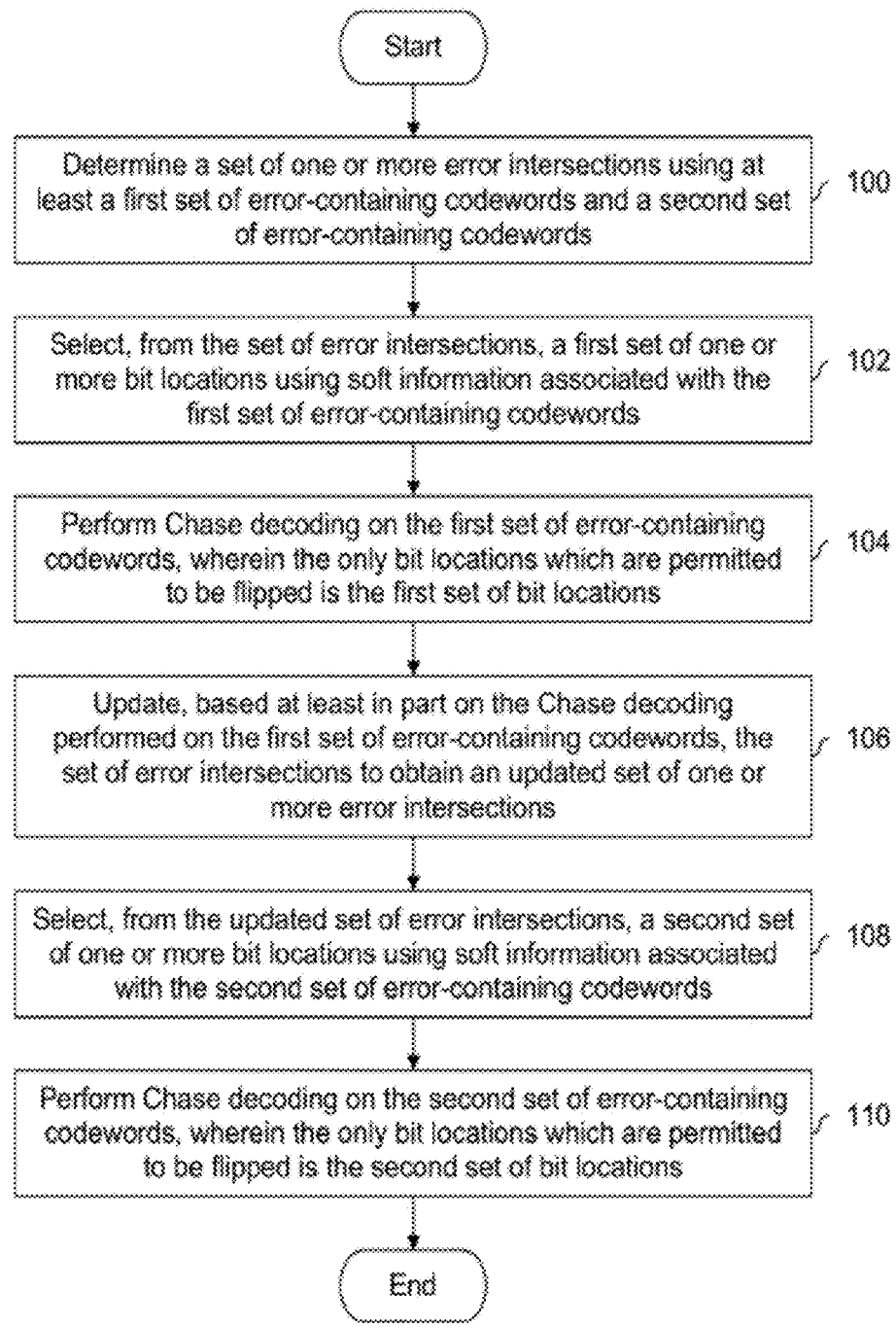
FIG. 1 is a flowchart illustrating an embodiment of a process for performing Chase decoding using an error intersection.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a flowchart illustrating an embodiment of a process for performing Chase decoding using an error intersection. In the example shown, the process is performed by a turbo-product code (TPC) decoder which is part of a read controller (which in turn may be part of a storage controller). In some embodiments, the process is triggered when a stuck error pattern is encountered (i.e., after one or more other less expensive TPC decoding techniques have failed to decode the TPC codeword).

At 100, a set of one or more error intersections is determined using at least a first set of error-containing codewords and a second set of error-containing codewords. As used herein, the term "error-containing codeword" refers to a codeword which has one or more bits flipped due to errors; technically, an error-containing codeword is not part of the code(book) whereas a codeword (without any errors) is part of the code(book).

Examples of step 100 are described in further detail, but in one example, the first set of error-containing codewords may be error-containing row codewords and the second set of error-containing codewords may be error-containing column codewords (or vice versa). As used herein, the term "error intersection" refers to an intersection of two or more error-containing codewords, such as an error intersection that occurs at an error-containing column codeword and an error-containing row codeword. A single error intersection may include one or more bits. In some embodiments, the first and/or second set of error-containing codewords has already been processed by one or more other TPC decoder techniques (e.g., which are less expensive than Chase decoding using error intersections). Note that the technique described herein is not limited to two codes or dimensions. For example, three codes may be used to determine the intersections at step 100. An example of this is described below.

At 102, a first set of one or more bit locations is selected from the set of error intersections using soft information associated with the first set of error-containing codewords. In some embodiments, there is a specified number of bit locations to be selected per error-containing codeword (e.g., fixed or programmable via a register). For example, two bit locations may be selected from each error-containing codeword in the first set of error-containing codewords. This step is described in further detail below but in one example the m (e.g., m=2) least reliable locations are selected.

At 104, Chase decoding is performed on the first set of error-containing codewords, wherein the only bit locations which are permitted to be flipped is the first set of bit locations. This technique offers improved performance over other Chase-related techniques because the bit locations which are permitted to be flipped by the Chase decoder are different, specifically in that they are more likely to actually be error locations. In embodiments described herein, the m (e.g., m=2) bit locations selected for the Chase decoder are selected from an error intersection, as opposed to being selected from the entire codeword. More detailed examples are described below. In some embodiments, a sliding window is used at step 104 so that fewer bit flip combinations are tested.

At 106, the set of error intersections is updated, based at least in part on the Chase decoding performed on the first set of error-containing codewords, to obtain an updated set of one or more error intersections. For example, the Chase decoding at step 104 may have been able to successfully decode an error-containing codeword from the first set of error-containing codewords. Any error intersection associated with that corrected codeword would be removed or eliminated at step 106.

At 108, a second set of one or more bit locations is selected from the updated set of error intersections using soft information associated with the second set of error-containing codewords. For example, a process which is similar to one which is used at step 102 may be employed (e.g., with the updated set of error intersections replacing the (initial) set or error intersections, and soft information associated with the second set of error-containing codewords replacing soft information associated with the first set of error-containing codewords).

At 110, Chase decoding is performed on the second set of error-containing codewords, wherein the only bit locations which are permitted to be flipped is the second set of bit locations. For example, the process of FIG. 5 may be used.

Note that the ordering of row-related processing and column-related processing in FIG. 1 and in examples described below are merely exemplary and are not intended to be limiting. In some embodiments, column-related processing is performed before row-related processing. Similarly, remarks and examples described herein with respect to rows or row-related processing are also applicable to columns or column-related processing.

In some applications it is desirable for the first set of error-containing codewords and the second set of error-containing codewords used at step 100 to be identified using TPC decoding techniques which mitigate or avoid miscorrections. In some embodiments, all TPC decoding iterations performed before the process shown in FIG. 1 include some type of miscorrection mitigation or avoidance. The technique described in FIG. 1 may have good performance when the quality of the information input to it (e.g., the first and second sets of error-containing codewords) is good and may have poor performance when the quality of the information input to it is poor. For example, improper identification of error-containing codewords may cause bit locations to be selected which do not actually contain an error. This in turn may cause a new error to be introduced which did not exist before. Note that any miscorrection mitigation or avoidance technique during TPC decoding may be used; the techniques described herein are not necessarily tied to any specific miscorrection mitigation or avoidance technique. In some cases, miscorrection mitigation or avoidance techniques may not be necessary, for example if the error correction capability of the constituent code(s) is/are such that the likelihood for miscorrection is very low.

Figure 2:
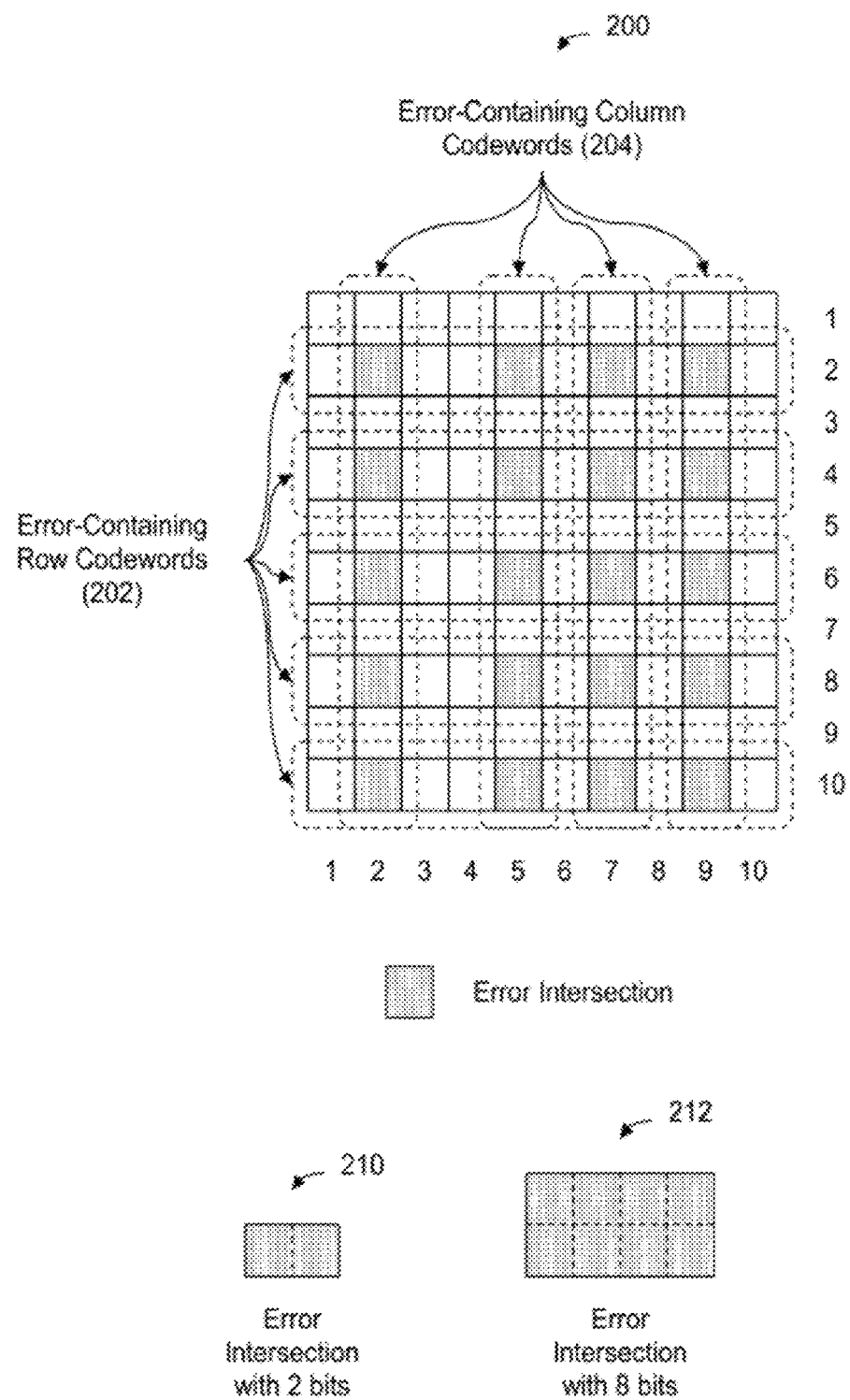
FIG. 2 is a diagram illustrating an embodiment of error intersections.

FIG. 2 is a diagram illustrating an embodiment of error intersections. TPC codeword 200 is an example of a TPC codeword. In the example shown, TPC codeword 200 has been processed at least once using a TPC decoder which includes a column decoder (for decoding all of the column codewords in TPC codeword 200) and a row decoder (for decoding all of the row codewords in TPC codeword 200). As a result of this decoding, it is known that the 2nd, 5th, 7th, and $9^{th}$ column codewords (i.e., error-containing column codewords 204) each contain one or more errors. Similarly, it is known that the 2nd, 4th, 6th, 8th, and $10^{th}$ row codewords (i.e., error-containing row codewords 202) contain one or more errors. Note that the row decoder and column decoder were unable to specifically identify the exact locations of the errors within the error-containing codewords. Error intersections occur where an error-containing column codeword intersects an error-containing row codeword and are shown with a shaded box. Referring back to FIG. 1, the shaded boxes show an example of error intersections which are determined at step 100.

Depending upon the TPC construction, each error intersection may include any number of bits. In error intersection 210, each error-containing row codeword is 1 bit "high" and each error-containing column codeword is 2 bits "wide" so that error intersection includes 2 bits. In error intersection 212, each error-containing row codeword is 2 bits "high" and each error-containing column codeword is 4 bits "wide" so that error intersection includes 8 bits.

Figure 3:
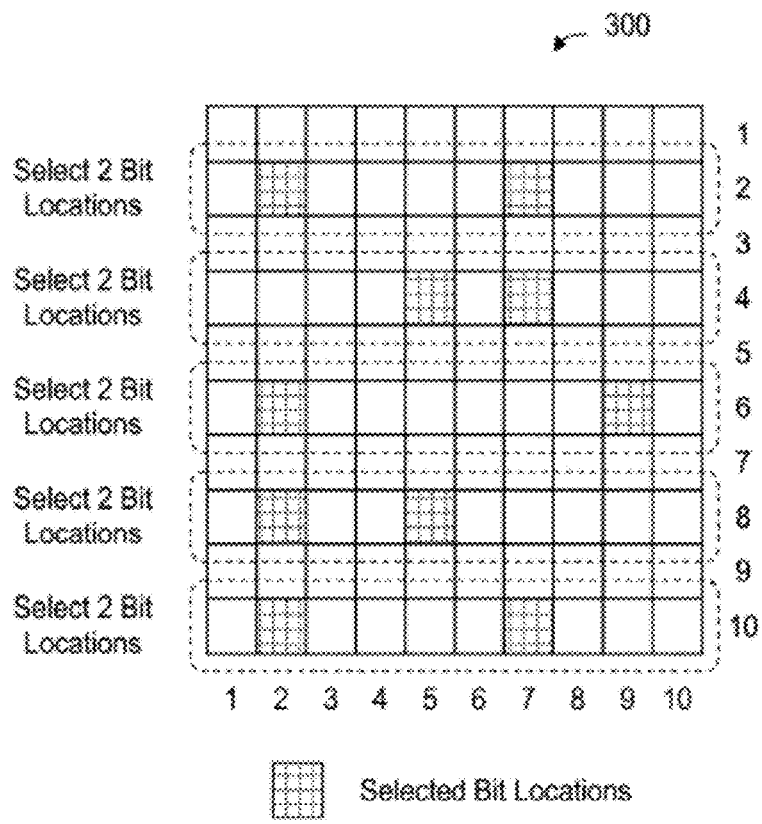
FIG. 3 is a diagram illustrating an embodiment of bit locations which are selected using soft information associated with error-containing row codewords.

FIG. 3 is a diagram illustrating an embodiment of bit locations which are selected using soft information associated with error-containing row codewords. FIG. 3 continues the example of FIG. 2. In this example, the 2nd, 4th, 6th, 8th, and $10^{th}$ row codewords are error-containing row codewords. Two bit locations are selected from each error-containing row codeword, based on the soft information associated with that particular error-containing row codeword, where the bit locations which are eligible to be selected are the errors intersections (see, e.g., FIG. 2). The two selected bit locations for each error-containing row codeword are shown with a grid pattern box in diagram 300. Referring back to FIG. 1, the grid pattern boxes show an example of bit locations which are selected at step 102. In this example, each error intersection includes only 1 bit and table 302 is reflective of this. Naturally, if each error intersection included two or more bits then table 302 would be modified accordingly. As shown in diagrams 210 and 212 in FIG. 1, a single error intersection may include any number of bits.

Diagram 302 shows the soft information associated with the 2nd, 4th, 6th, 8th, and $10^{th}$ error-containing row codewords which caused the bit locations shown in diagram 300 to be selected. In this example, soft information comprises log-likelihood ratio (LLR) values. With LLR values, the sign (e.g., positive or negative) corresponds to a decision (e.g., a negative sign corresponds to a 1 decision and a positive sign corresponds to a 0 decision) and the magnitude corresponds to a certainty or likelihood in that decision.

In this example, the two bit locations having the two smallest magnitude LLR values are selected. Consider, for example, the 2nd error-containing row codeword. The 2nd bit location and the $7^{th}$ bit location are selected for 2nd error-containing row codeword because the magnitudes of the LLR values associated with those locations are the smallest magnitudes (e.g., |0|<|+3| and |0|<|−3|).

Note that the table shown in diagram 302 only shows LLR values for the 2nd, 5th, 7th, and $9^{th}$ bit locations. This is because those bit locations correspond to error intersections. Other bit locations (which do not correspond to an error intersection) are not eligible to be selected, so those LLR values are not shown.

Using the selected bits shown in this figure, Chase decoding at step 104 in FIG. 1 would be performed on the 2nd error-containing row codeword (where only the 2nd bit location and the $7^{th}$ bit location are permitted to be flipped, as desired), Chase decoding would be performed on the $4^{th}$ error-containing row codeword (where only the $5^{th}$ bit location and the $7^{th}$ bit location are permitted to be flipped, as desired), Chase decoding would be performed on the 6th error-containing row codeword (where only the 2nd bit location and the $9^{th}$ bit location are permitted to be flipped, as desired), Chase decoding would be performed on the $8^{th}$ error-containing row codeword (where only the 2nd bit location and the $5^{th}$ bit location are permitted to be flipped, as desired), and Chase decoding would be performed on the $10^{th}$ error-containing row codeword (where only the 2nd bit location and the $7^{th}$ bit location are permitted to be flipped, as desired).

The following figure describes a process for selecting bit locations, where the process accounts for when the number of error intersections in an error-containing codeword is less than a specified number of bits to be selected.

Figure 4:
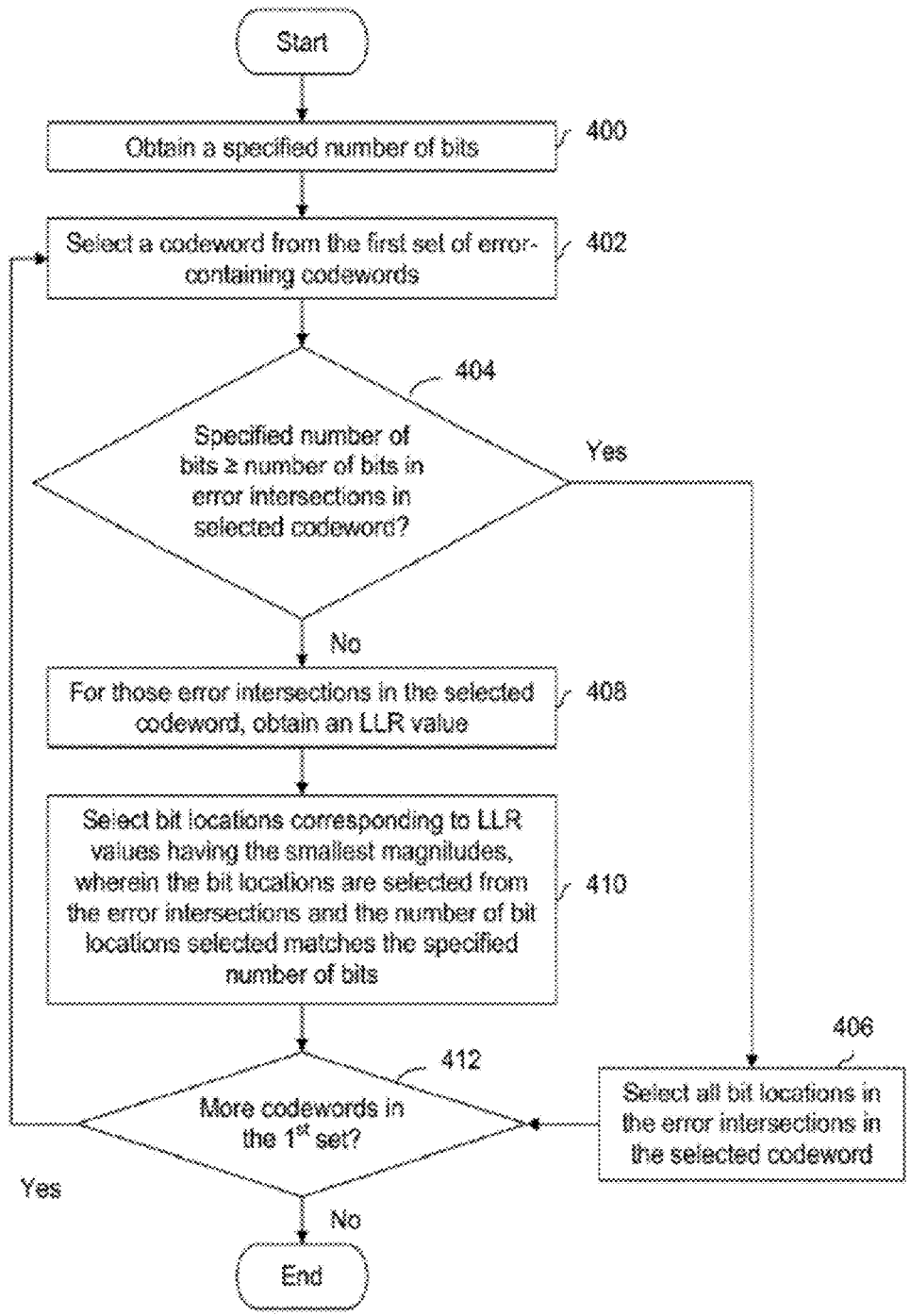
FIG. 4 is a flowchart illustrating an embodiment for selecting bit locations using soft information.

FIG. 4 is a flowchart illustrating an embodiment for selecting bit locations using soft information. In some embodiments, step 102 in FIG. 1 is performed using the process of FIG. 4. In some embodiments, step 108 in FIG. 1 is performed using a process which is similar to FIG. 4.

At 400, a specified number of bits is obtained. This specified number corresponds to a number of bits which is desired to be selected. For example, in FIG. 3, the specified number of bits is 2.

At 402, a codeword is selected from the first set of error-containing codewords. For example, suppose the 2nd error-containing row codeword in FIG. 3 is selected.

At 404 it is determined if the specified number of bits is greater than or equal to the number of bits in the error intersections in the selected codeword. To continue the example from above (where each error intersection only includes 1 bit), the specified number of bits to select in FIG. 3 is 2 and the number of bits in the error intersections in the exemplary 2nd error-containing row codeword in FIG. 3 is 4, so the decision at step 404 would be No.

If the decision at step 404 is Yes, then at 406 all bit locations in the error intersections in the selected codeword are selected. Even though the number of selected bit locations will be less than or equal to the specified number of bits to select, it may be undesirable to permit the Chase decoder to flip a bit location which is not an error intersection.

If the decision at step 404 is No, then at 408 an LLR value is obtained for those error intersections in the selected codeword. For example, for the 2nd error-containing row codeword in FIG. 3, an LLR value of 0 for the 2nd bit location is obtained, an LLR value of +3 is obtained for the $5^{th}$ bit location, an LLR value of 0 is obtained for the $7^{th}$ bit location, and an LLR value of −3 is obtained for the $9^{th}$ bit location.

At 410, bit locations corresponding to LLR values having the smallest magnitudes are selected, wherein the bit locations are selected from the error intersections and the number of bit locations selected matches the specified number of bits. For the 2nd error-containing row codeword, two bit locations are selected. Since the 2nd bit location and the 7th bit location have LLR values with the smallest magnitudes (i.e., $|0|<|+3|$ and $|0|<|-3|$), those two bit locations are selected.

After step 406 or after step 410, it is determined at 412 if there are more codewords in the first set. If so, a next codeword is selected from the first set of error-containing codewords at 402. For example, in diagram 302 in FIG. 3, the 4th error-containing row codeword would be selected next.

The following figure describes a more detailed example of Chase decoding, where only specified bit locations are permitted to be flipped.

Figure 5:
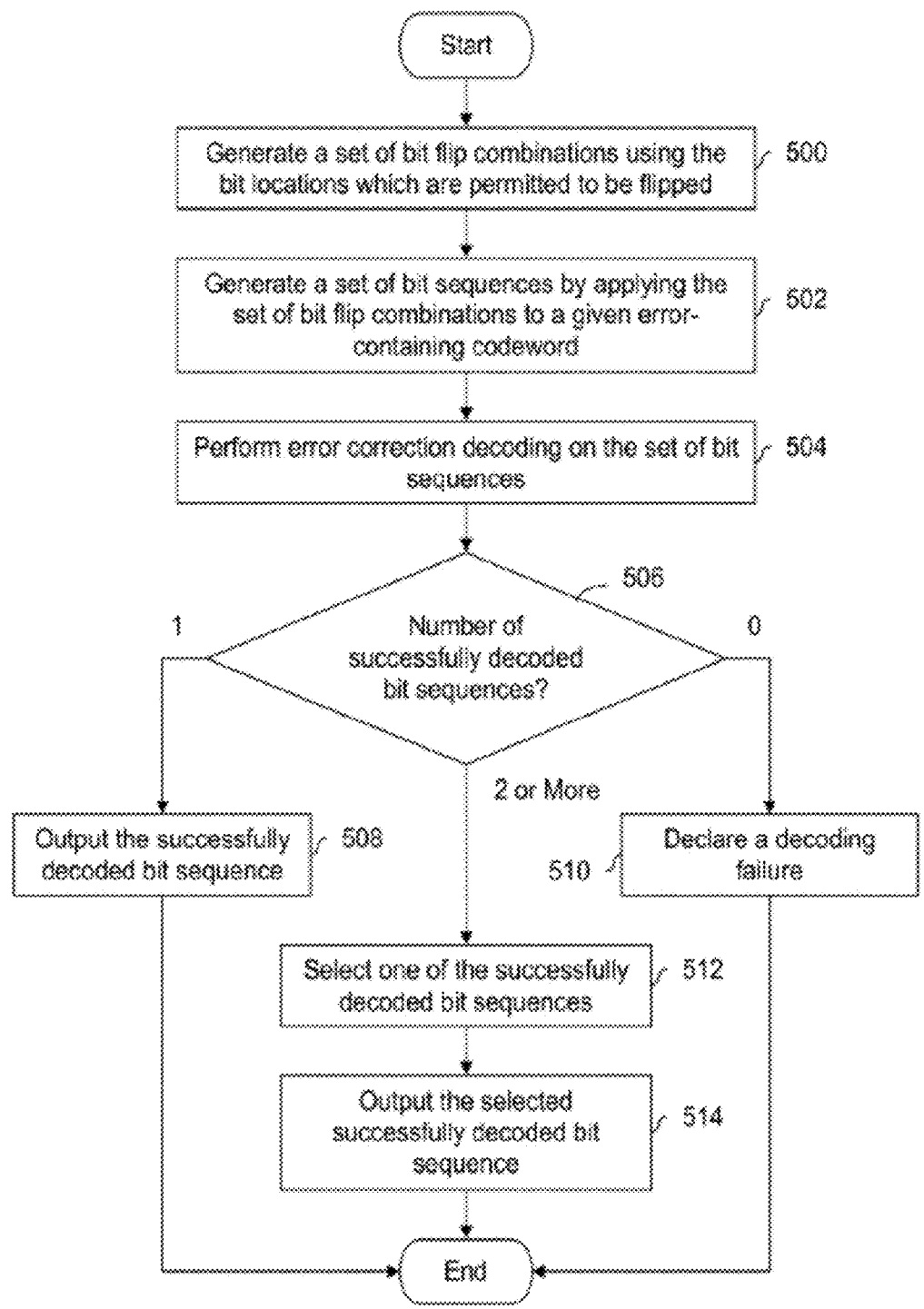
FIG. 5 is a flowchart illustrating an embodiment of Chase decoding where bit locations which are permitted to be flipped are selected from error intersection(s).

FIG. 5 is a flowchart illustrating an embodiment of Chase decoding where bit locations which are permitted to be flipped are selected from error intersection(s). In some embodiments, step 104 and/or step 110 in FIG. 1 is/are performed using the process of FIG. 5. In some embodiments, the process shown is a hard decision decoding process (e.g., likelihood or reliability information is not used during decoding). In various embodiments, the process shown is applied to either error-containing row codewords or error-containing column codewords.

At 500, a set of bit flip combinations is generated using the bit locations which are permitted to be flipped. For example, suppose the process of FIG. 5 is being performed on the 2nd error-containing row codeword in FIG. 3. In that particular case, the 2nd bit location and the $7^{th}$ bit location are the bit locations which are permitted to be flipped. In that example, the set of bit flip combinations generated at step 500 would be: {(do not flip the 2nd bit position, do not flip the $7^{th}$ bit position); (do not flip the 2nd bit position, flip the $7^{th}$ bit position); (flip the 2nd bit position, do not flip the 7th bit position); (flip the 2nd bit position, flip the $7^{th}$ bit position)}. Although the bit flip combination (do not flip the 2nd bit position, do not flip the $7^{th}$ bit position) is possible, it is assumed that that combination has already been explored and decoding was not successful with that bit flip combination.

At 502, a set of bit sequences is generated by applying the set of bit flip combinations to a given error-containing codeword. Using the 2nd error-containing row codeword in FIG. 3 as an example, a first bit sequence would be generated by flipping no bits, a second bit sequence would be generated by flipping just the $7^{th}$ bit position, a third bit sequence would be generated by flipping just the 2nd bit position, and a fourth bit sequence would be generated by flipping both the 2nd bit position and the $7^{th}$ bit position.

At 504, error correction decoding is performed on the set of bit sequences. To continue the example from above, error correction decoding would be performed four times: on the bit sequence with no bits flipped, on the bit sequence with the $7^{th}$ bit position flipped, on the bit sequence with the 2nd bit position flipped, and on the bit sequence with both the 2nd bit position and the $7^{th}$ bit position flipped.

At 506, the number of successfully decoded bit sequences is determined. If there is one successfully decoded bit sequence, the successfully decoded bit sequence is output at 508. If there are no successfully decoded bit sequences, a decoding failure is declared at 510. If there are two or more successfully decoded bit sequences, one of the successfully decoded bit sequences is selected at 512 and the selected successfully decoded bit sequence is output at 514. Any particular technique may be used to select at step 512. For example, a maximum likelihood (ML) technique may be used where a probability may be generated for each successfully decoded modified codeword and the successfully decoded modified codeword with the best probability is selected.

In some embodiments, the Chase decoding process described in FIG. 5 includes miscorrection detection. For example, before any correction(s) which are suggested by the Chase decoder are actually applied, they are checked by some miscorrection detector. (Any appropriate miscorrection detection technique may be used.) If the miscorrection detector decides that the suggested correction(s) (likely) include a miscorrection (e.g., a correction of a bit which is not actually wrong, which would cause a new error to be injected), then the suggested correction(s) are not made. If the miscorrection detector decides that the suggested correction(s) (likely) do not include a miscorrection (e.g., the suggested correction(s) will fix actual errors and not introduce new errors), then the suggested correction(s) are made.

The following figure shows an example of updated error intersections.

Figure 6:
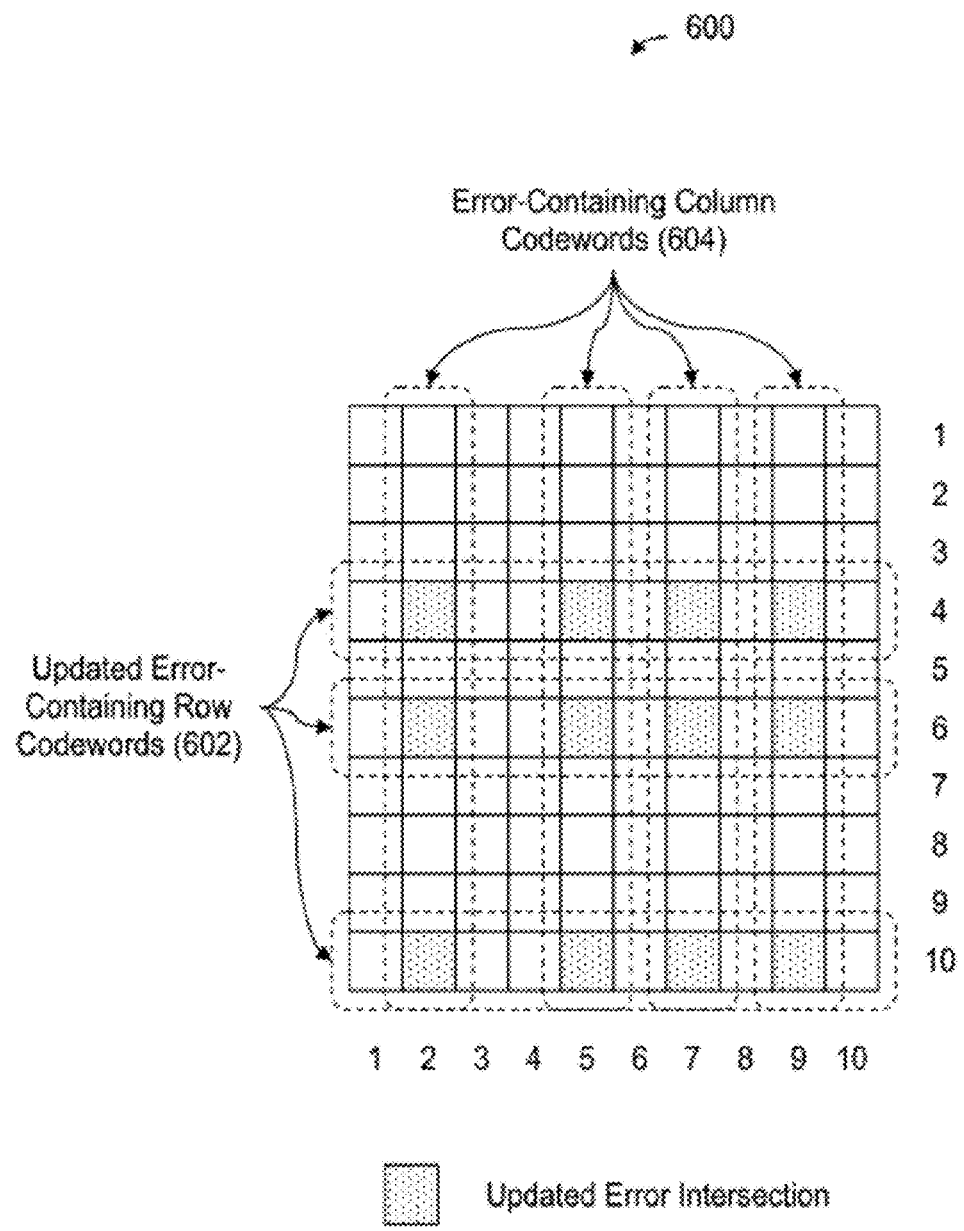
FIG. 6 is a diagram illustrating an embodiment of updated error intersections.

FIG. 6 is a diagram illustrating an embodiment of updated error intersections. FIG. 6 continues the example of FIG. 3, where the 2nd row codeword and the $8^{th}$ row codeword have been successfully decoded (e.g., at step 104 in FIG. 1). As a result of being successfully decoded, the 2nd row codeword and the $8^{th}$ row codeword are no longer considered error-containing row codewords and updated error-containing row codewords (602) includes only the 4th, 6th, and $10^{th}$ row codewords. The error-containing column codewords (604) remain the same and still are the 2nd, 5th, 7th, and 9th column codewords.

Updated error intersections are located where one of updated error-containing row codewords (602) intersects one of error-containing column codewords (604) and are shown with dotted boxes. In some applications it is desirable to update the error intersections because it is undesirable to permit the second pass of Chase decoding at step 110 in FIG. 1 to flip a bit which has already been corrected by the first pass of Chase decoding. For example, the Chase decoder may have better performance (e.g., as measured by some error rate) when a more accurate set of bit locations which is permitted to be flipped is specified and/or permitting the Chase decoder to flip a bit location which is associated with a now-corrected codeword may permit a new error to be introduced into the system.

Figure 7:
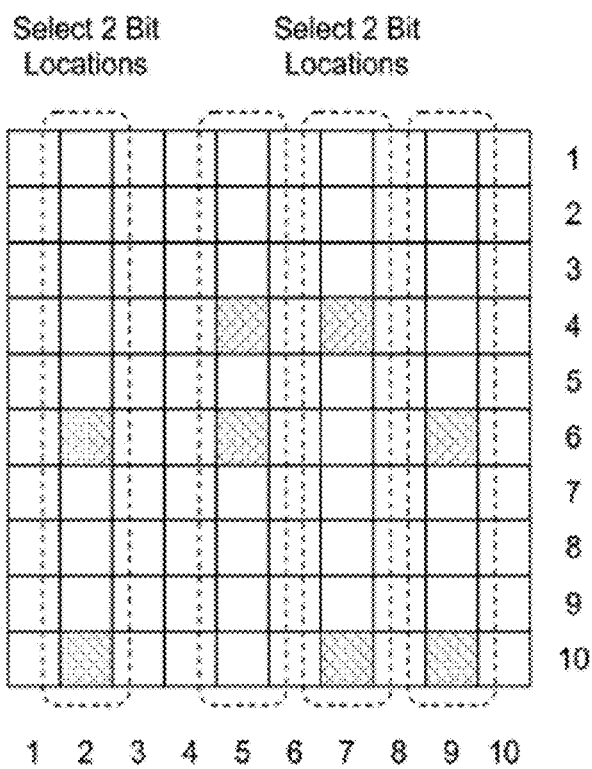
FIG. 7 is a diagram illustrating an embodiment of bit locations which are selected from updated error intersections.

FIG. 7 is a diagram illustrating an embodiment of bit locations which are selected from updated error intersections. FIG. 7 continues the example of FIG. 6. In the example shown, two bit locations are selected from each of the 2nd, 5th, 7th, and $9^{th}$ column codewords (i.e., the error-containing column codewords). Note that the bit locations which are eligible to be selected are the updated error intersections (see FIG. 6).

To continue the example from above, the two bit locations corresponding to the two lowest LLR magnitudes are selected for each of the error-containing column codewords. For brevity, exemplary LLR values are not shown in this figure. In some embodiments, a process similar to FIG. 4 is used to select the bit locations shown (e.g., where an updated set of error intersections replaces the (initial) set or error intersections, and soft information associated with the second set of error-containing codewords replaces soft information associated with the first set of error-containing codewords).

The following figures describe some exemplary diagrams of systems which perform the processes described above.

Figure 8:
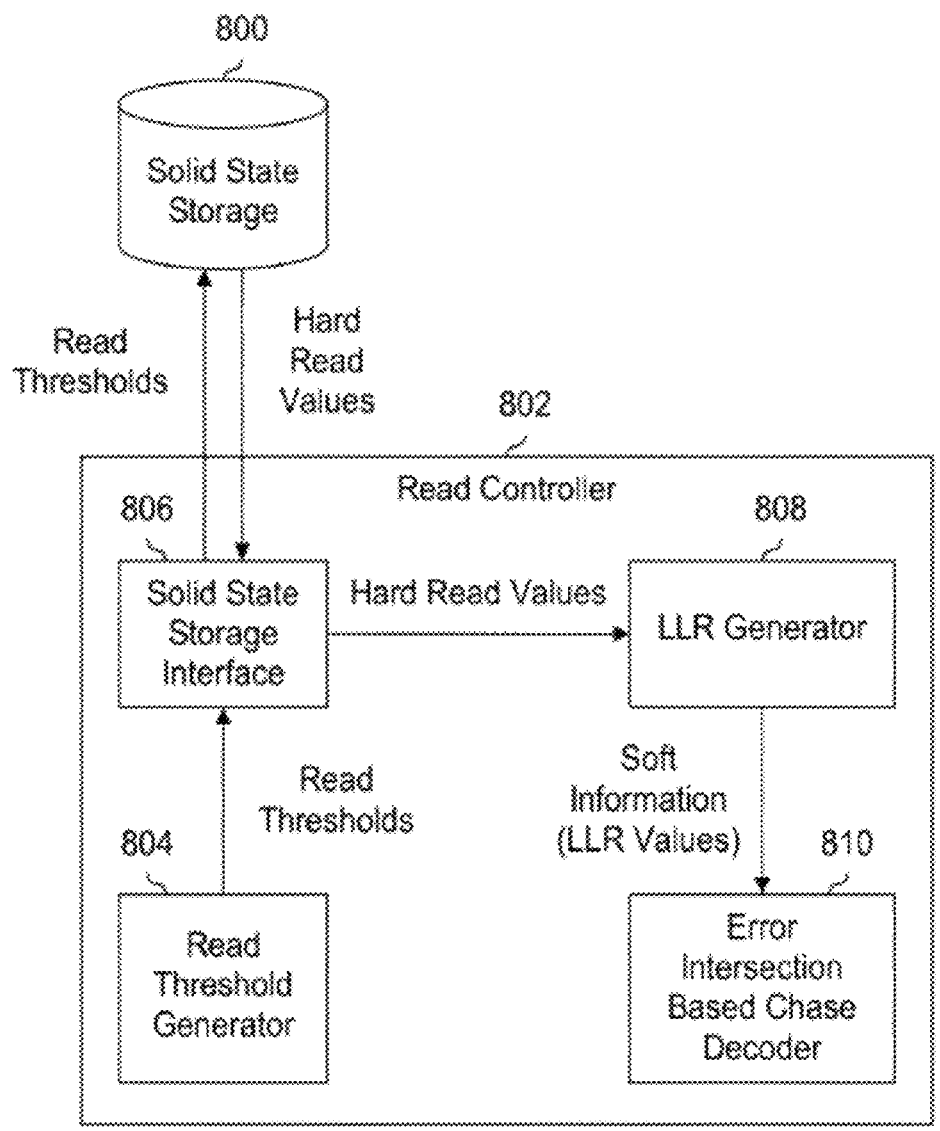
FIG. 8 is a diagram showing an embodiment of a read controller which includes a log-likelihood ratio (LLR) generator and a Chase decoder which uses error intersections.

FIG. 8 is a diagram showing an embodiment of a read controller which includes a log-likelihood ratio (LLR) generator and a Chase decoder which uses error intersections. In the example shown, read controller 802 is part of a storage controller (not shown) which writes to and reads from solid state storage 800. In some embodiments, a storage controller (including read controller 802) is implemented on a semiconductor device, such as an application-specific integrated circuit (ASIC) or a field-programmable gate array (FPGA). Solid state storage 800 may comprise another semiconductor device.

Solid state storage 800 natively or intrinsically returns hard read values and so read controller 802 includes the following components in order to provide error intersection based Chase decoder 810 with soft information, in this case LLR values. Read threshold generator 804 is responsible for generating two or more read thresholds, for example in the form of voltages. For convenience, the example which follows will use two read thresholds but in some other embodiments three or more reads are performed. The two read thresholds are passed to solid state storage interface 806 which performs two reads of solid state storage 800 using the two read thresholds. In response to the two reads at a first read threshold and second read threshold, two arrays of hard read values are returned. The returned hard read values are passed from solid state storage 800 to solid state storage interface 806 to LLR generator 808. Using the two arrays of hard read values, LLR generator 808 generates soft information in the form of LLR values. The soft information in turn is passed from LLR generator 808 to error intersection based Chase decoder 810.

Figure 9:
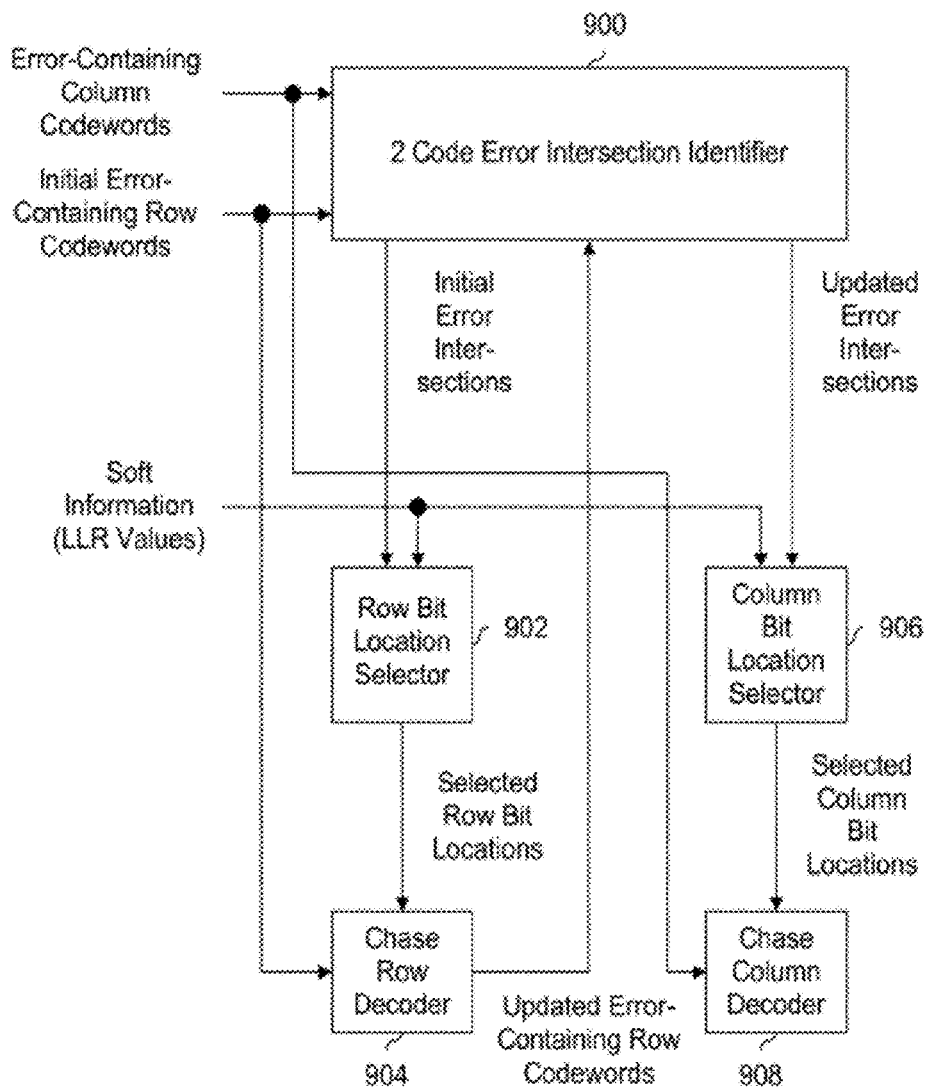
FIG. 9 is a diagram illustrating an embodiment of a Chase decoder which uses error intersections.

FIG. 9 is a diagram illustrating an embodiment of a Chase decoder which uses error intersections. In some embodiments, error intersection based Chase decoder 810 in FIG. 8 is implemented as shown in FIG. 9. In this particular example, row-related processing is performed first, but naturally some other embodiments may perform column-related decoding first.

Error intersection identifier 900 inputs initial error-containing row codewords and error-containing column codewords and outputs initial error intersections.

The initial error intersections are passed from error intersection identifier 900 to row bit location selector 902. Using the initial error intersections and soft information (e.g., in the form of LLR values), row bit location selector 902 selects row bit locations.

The selected row bit locations are passed from row bit location selector 902 to Chase row decoder 904. Chase row decoder 904 is configured so that only the selected row bit locations are permitted to be flipped as desired. Using the initial error-containing row codewords and the selected row bit locations, Chase row decoder 904 generates updated error-containing row codewords (e.g., those row codewords that Chase row decoder 904 was unable to successfully decode).

The updated error-containing row codewords are passed from Chase row decoder 904 to error intersection identifier 900. Using the updated error-containing row codewords and the error-containing column codewords, updated error intersections are generated.

The updated error intersections are passed from error intersection identifier 900 to column bit location selector 906. Using the updated error intersections and the soft information, column bit locations are selected by column bit location selector 906. In order to clearly explain the technique, row bit location selector 902 and column bit location selector 906 are shown as separate components. In some other embodiments, row bit location selector 902 and column bit location selector 906 are combined into a single component.

The selected column bit locations are passed from column bit location selector 906 to Chase column decoder 908, which is constrained to only flip the specified column bit locations in the error-containing column codewords. In some other embodiments, Chase row decoder 904 and Chase column decoder 908 are implemented as a single Chase decoder.

When the system shown in FIG. 9 is used to address a stuck error pattern problem, ideally, Chase row decoder 904 and Chase column decoder 908 are able to fix enough bits so that the stuck error pattern becomes a fixable error pattern (i.e., the system is no longer stuck). The system may either perform another iteration of Chase decoding using error intersections, or some other TPC decoding technique may be used at the next iteration. For example, the system shown in FIG. 9 may be used in an iterative manner where row decoding is followed by column decoding which is following by row decoding, and so on. This process may continue until (for example) all errors have been removed or a maximum number of Iterations is reached.

As described above, in some applications it is desirable for error-containing row codewords and error-containing column codewords to be identified using TPC decoders which include miscorrection mitigation or avoidance techniques. The following figure shows an example of a miscorrection.

Figure 10:
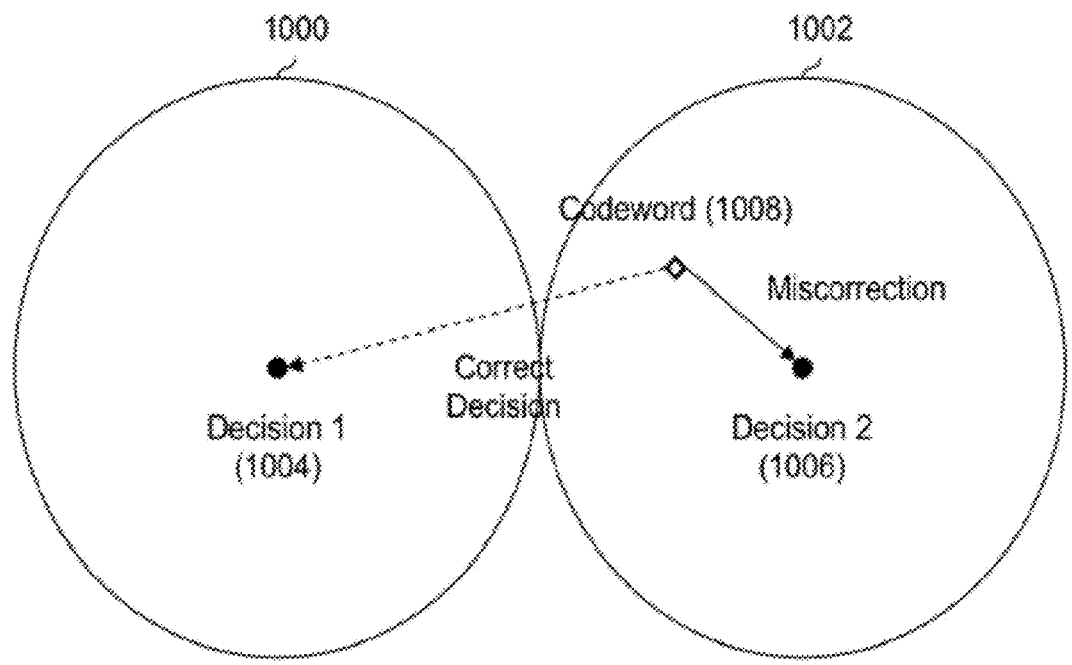
FIG. 10 is a diagram illustrating an embodiment of a miscorrection.

FIG. 10 is a diagram illustrating an embodiment of a miscorrection. In the example shown, circles 1000 and 1002 represent decoding logic. If a codeword (e.g., a row codeword or a column codeword) is input which falls into circle 1000, then a first decision (1004) is made and output. If the codeword falls into circle 1002, then a second decision (1006) is made and output. In other words, all codewords which fall into a given circle are corrected (e.g., using whatever bit flips are required to get that particular codeword to match the particular decision) so that the same decision is output for all codewords which fall into a given circle.

A miscorrection occurs when a codeword falls into a circle which it should not have. This sometimes occurs when the codeword has more errors than the error correction capability of the code. (The radius of circles 1000 and 1002 corresponds to the error correction capability of the code.) The correct decision for codeword 1008 is the first decision (1004). However, because codeword 1008 falls into circle 1002, the decoder will select the second decision (1006). This causes a miscorrection, where the decoder thinks it has successfully decoded the codeword in question but in fact it has actually introduced errors into that codeword.

TPC codewords are particularly susceptible to miscorrections when the component codes used (e.g., to encode the rows and columns) are weak codes (e.g., they are only capable of correcting 3, 4, or 5 bits). A weaker code (like the kinds typically used in TPC) corresponds to a smaller radius of circles 1000 and 1002, meaning that the circles are closer to each other and it is easier for a miscorrection to occur.

Since the bit locations which are permitted to be flipped by the Chase decoder are selected from the error intersections, it is important to know that the error-containing rows and error-containing columns can be relied upon, both in the sense that what is identified as containing an error actually does and what is identified as not containing an error is, in fact, error free. The performance of the technique described herein may depend upon the quality of the information input to it, so it is desirable to supply the decoder with good quality information.

The following figure shows an example of a TPC decoding plan.

FIG. 11 is a diagram illustrating a TPC decoding plan which includes Chase decoding using error intersections. In the first step, hard TPC decoding is performed. For example, row decoding and column decoding are both performed until the decoding gets stuck or reaches maximum number of iterations. At the second step, error intersections are estimated. For example, the hard decoding information from step 1 can be used to find the error locations. At the third step, Chase decoding using error intersections is performed. At the fourth step, the process repeats hard TPC decoding, for example until everything gets decoded or a maximum number of iterations is reached.

In various embodiments, any number of steps 1-3 is/are performed with some type of miscorrection detection or avoidance. Naturally, the TPC decoding plan shown herein is merely exemplary and is not intended to be limiting.

As described above, any number of codes may be used to determine error intersections at step 100 in FIG. 1. The following figures describe such an example where a third code (referred to as a master code) is used to refine a coarse error intersection which is identified using a row code and a column code.

Figure 12:
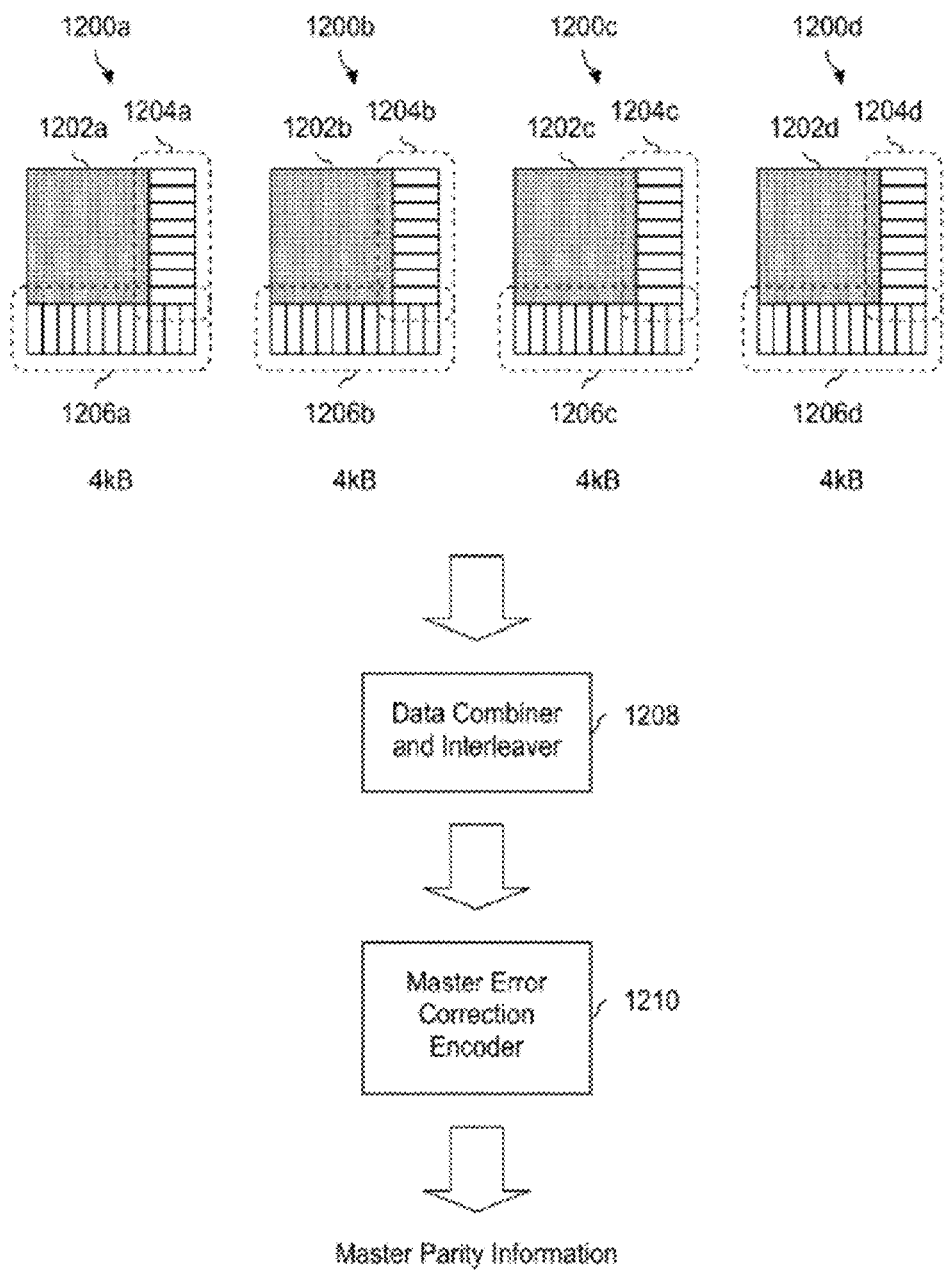
FIG. 12 is a diagram illustrating an embodiment of a master code architecture.

FIG. 12 is a diagram illustrating an embodiment of a master code architecture. In the example shown, each of TPC codewords 1200a-1200d are TPC encoded. For example, payloads 1202a-1202d are first encoded in the horizontal direction to produce row parity information 1204a-1204d. Then, payloads 1202a-1202d and row parity information 1204a-1204d are encoded in the vertical direction to produce column parity information 1206a-1206d.

TPC codewords 1200a-1200d (each of which is 4 kB) are then combined and interleaved together (e.g., so that the number of bits going in to data combiner and interleaver 1208 is the same as the number of bits going in, but the sequence or ordering of the bits has been re-arranged). The interleaved data is passed to master error correction encoder 1210, which (at least in this example) is a systematic encoder. Master error correction encoder 1210 generates master parity information, which is stored in storage (e.g., NAND Flash) with TPC codewords 1200a-1200d.

It is noted that because TPC codewords 1200a-1200d are stored in the form shown in FIG. 12, it is theoretically possible (e.g., If the read-back information is of sufficiently good quality) to individually decode any one of TPC codewords 1200a-1200d using just row decoding and column decoding, without having to perform master decoding, and without having to decode any of the other TPC codewords. In some systems, decoding using the master parity information is used on an "if needed" basis because most TPC codewords will be able to be decoded using just row decoding and column decoding and/or there may some additional costs associated with decoding using the master code (e.g., having to fetch 16 kB of data across a NAND channel between a storage controller and the storage media). In one example, if Individual 4 kb decoding has already been tried multiple times (e.g., according to FIG. 11) and one or more of those 4 4 kb data fails, master code decoding and refining is tried. This ensures that 16 kb of data is not retrieved unnecessarily.

Figure 13:
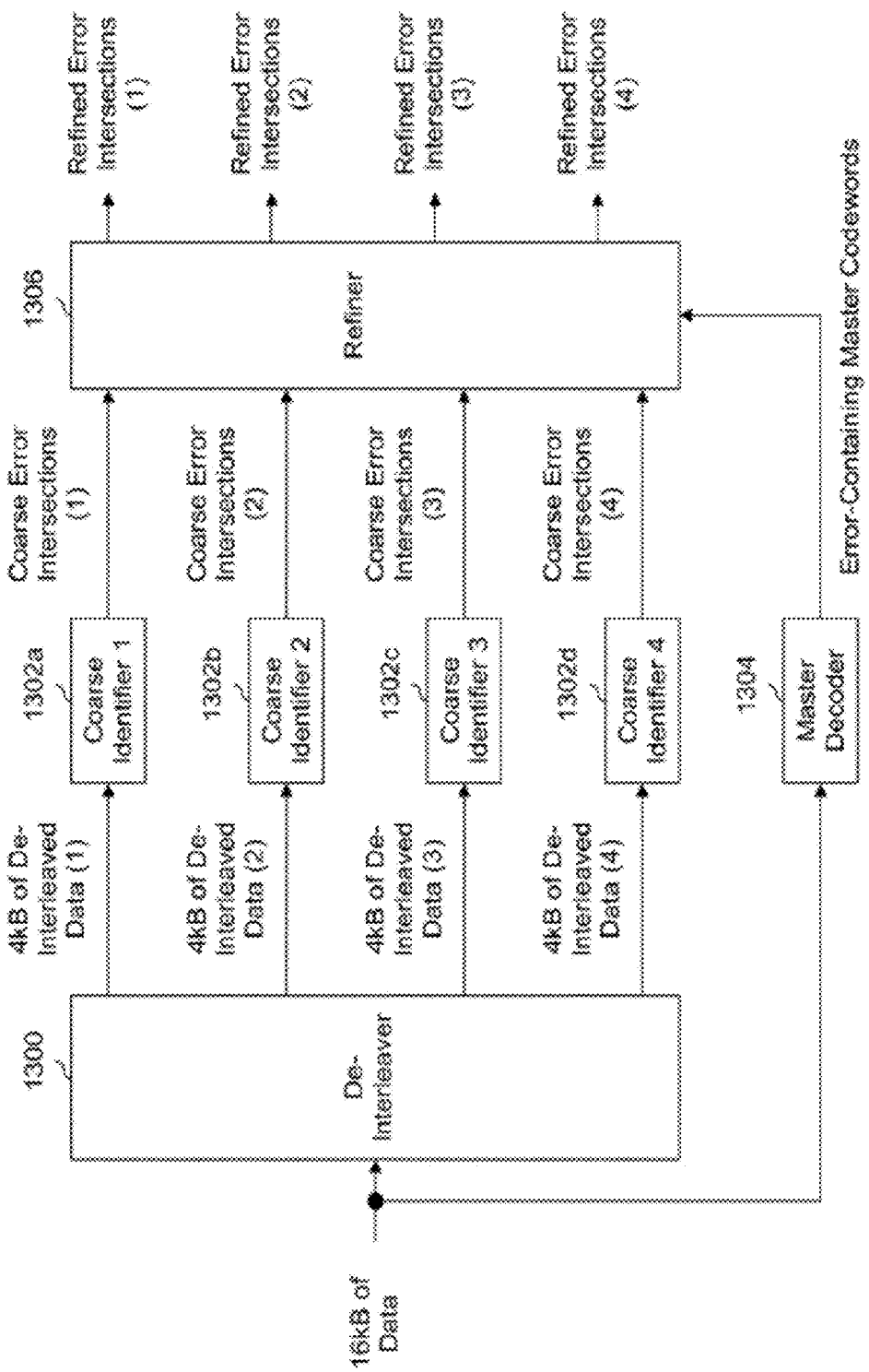
FIG. 13 is a diagram illustrating an embodiment of a 3-code error intersection identifier.

FIG. 13 is a diagram illustrating an embodiment of a 3-code error intersection identifier. In some embodiments, step 100 in FIG. 1 is performed by the exemplary 3-code error intersection identifier shown where error-containing row codewords, error containing column codewords, and error-containing master codewords are used to identify error intersections: first coarsely using the error-containing row codewords and error containing column codewords, and then refining those results using the error-containing master codewords.

In the example shown, the 3-code structure shown in FIG. 12 is used. 16 kB of data is input to de-interleaver 1300. In various embodiments, the 16 kB of data may have already been processed by any number of decoding techniques (e.g., hard vs. soft decoding, 2 codes vs. 3 codes, etc.), so that any number of errors may have already been removed. De-interleaver 1300 separates and rearranges the 16 kB of data into 4 4 kB de-interleaved data sequences, one for each of coarse identifiers 1302a-1302d.

Coarse identifiers 1302a-1302d generate coarse error intersections based on error-containing row codewords and error-containing column codewords (e.g., without taking into consideration the master code). In one example, each coarse identifier generates row syndromes and column syndromes and determines which row syndromes and column syndromes are non-zero (the error-containing row codewords and error-containing column codewords are those which have non-zero row syndromes and non-zero column syndromes, respectively). The intersections of the error-containing row codewords and error-containing column codewords produce the coarse error intersections which are output by coarse identifiers 1302a-1302d. For example, this process is similar to that shown in FIG. 2.

Master decoder 1304 inputs the 16 kB of data and identifies the error-containing master codewords (e.g., using the third or master code on 16 kB of data). Similar to the process described above, this may include generating master syndromes and determining which master syndromes are non-zero. The error-containing master codewords correspond to the non-zero master syndromes.

Using the information from the master code, the coarse error intersections are refined by refiner 1306. This refinement process is described in further detail below, but in general the process involves eliminating bits from the coarse error intersections based on the decoding results of the master code. Refiner 1306 outputs 4 sets of refined error intersections, each of which corresponds to one of the 4 kB of data (1200a-1200d) shown in FIG. 12. These refined error intersections may be used by an error intersection based Chase decoder in the manner described above.

In some embodiments, the processing shown is performed after the processing shown in FIG. 11. For example, using the processing shown in FIG. 11 may correct most of the errors in each individual 4 kB of data and this processor may remove some or all of the remaining errors.

Figure 14:
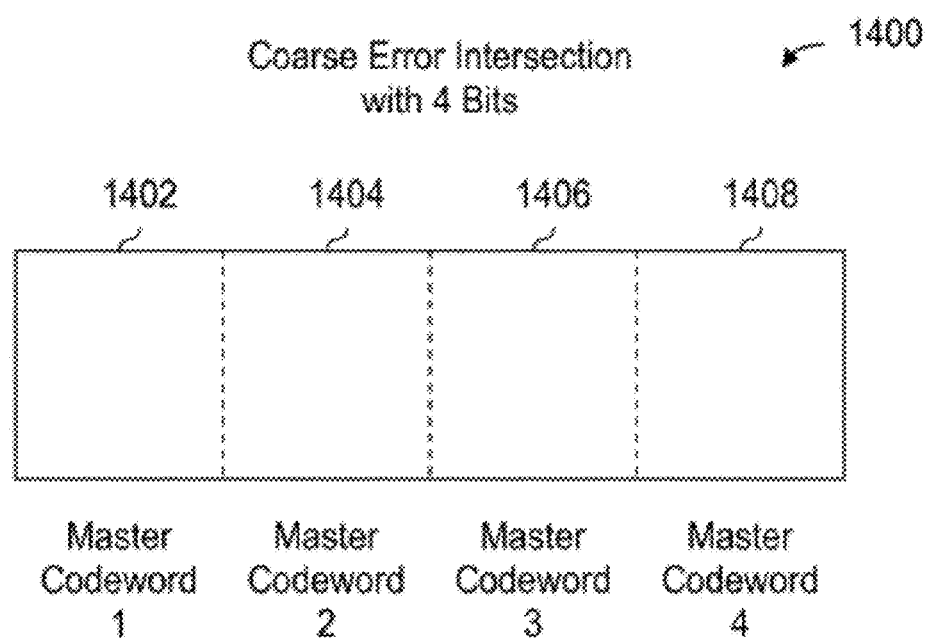
FIG. 14 shows an embodiment of coarse error intersections which are refined using information from a master code.

FIG. 14 shows an embodiment of a coarse error intersection which is refined using information from a master code. In the example shown, coarse error intersection 1400 corresponds to an intersection between an error-containing row codeword and an error-containing column codeword. Referring back to FIG. 13, coarse error intersection 1400 may be identified by any one of coarse identifiers 1302a-1302d.

In this exemplary TPC construction, coarse error intersection 1400 includes 4 bits. As shown in FIG. 2, in some embodiments an error intersection includes two or more bits. Each of the 4 bits in coarse error intersection 1400 corresponds to a different master codeword: bit 1402 corresponds to a first master codeword, bit 1404 corresponds to a second master codeword, bit 1406 corresponds to a third master codeword, and bit 1408 corresponds to a fourth master codeword. Depending upon which master codewords are identified as containing an error (e.g., by error-containing master codeword identifier 1304 in FIG. 13), coarse error intersection 1400 can be refined. For example, master decoding is performed on the 16 kB of data which reveals that the first and second master codes are decodable whereas the third and fourth master codes are not decodable. Bits 1402 and 1404 are corrected and coarse error intersection is refined down to bits 1406 and 1408 (e.g., where bits 1406 and 1408 lie in whichever individual 4 kb code contains those bits). Referring back to FIG. 13, bits 1406 and 1408 are an example of a refined error intersection which is output by refiner 1306.

As described above, using a master code during decoding may be more expensive compared to some other decoding approaches and in some applications a 3-code, error intersection base Chase decoding technique is not attempted unless some other decoding techniques have already been attempted. For example, in some applications, a 2-code, error intersection base Chase decoding technique (e.g., performed individually on any one of the 4 kB of data shown in FIG. 12) is attempted first before a 3-code, error intersection base Chase decoding technique (e.g., performed on the 16 kB of combined and interleaved data shown in FIG. 12, plus the master parity information) is attempted. In that example, the 2-code approach only requires retrieval of 4 kB of data from storage, whereas the 3-code approach requires retrieval of 16 kB of data, plus the master parity information, from storage.

In general, the Chase-related technique described above has better performance when m (i.e., the number of bits flipped by the Chase decoder) is larger. However, increasing m comes at a significant cost since the Chase decoder has to perform decoding on $2^m$ bit sequences. Analysis of stuck errors has indicated that actual errors sometimes extend beyond the first m least reliable bits (where m is some typical or acceptable value). Instead, the actual errors are within the first m' least reliable bits where m'>m. In other words, for stuck errors (and possibly other scenarios) it would be desirable to try flipping more bits than is currently typical or desirable. The following describes a sliding window technique which permits more bits to be flipped (overall) while keeping the number of attempts down.

Figure 15:
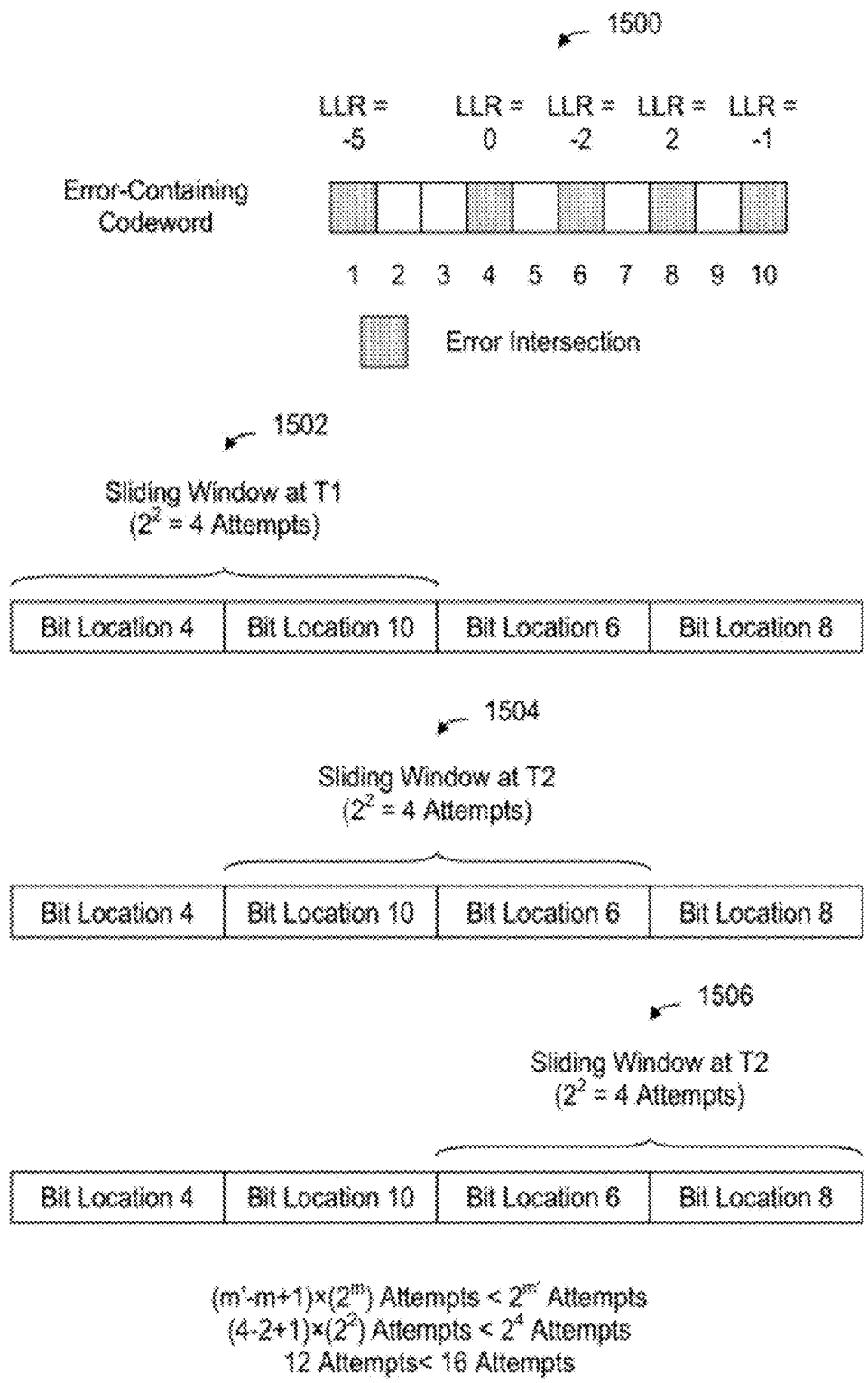
FIG. 15 is a diagram illustrating an embodiment of a sliding window.

FIG. 15 is a diagram illustrating an embodiment of a sliding window. In some embodiments, selecting bit locations at step 102 and/or 108 in FIG. 1 includes use of a sliding window. Diagram 1500 shows an error-containing codeword which includes 5 error intersections at bit locations 1, 4, 6, 8, and 10. For simplicity, assume that each error intersection includes only 1 bit. In this example, m=2 and m'=4. As used herein, m' may be referred to as the range of the sliding window and m may be referred to as a window size of the sliding window. In some applications, m' is selected to be large enough to capture stuck error patterns, for example based on simulations and/or analysis of real-world stuck error patterns.

In this example, soft information is in the form of log-likelihood ratio (LLR) values where the sign (e.g., + or −) corresponds to a (e.g., hard) decision and the magnitude corresponds to a likelihood or certainty (e.g., where a smaller magnitude corresponds to less certainty or a less reliable bit). Bit location 1 has an LLR value of −5, bit location 4 has an LLR value of 0, bit location 6 has an LLR value of −2, bit location 8 has an LLR value of 2, and bit location 10 has an LLR value of −1. For m'=4, the 4 bit locations with the lowest magnitude LLR values are selected and sorted according to reliability. In this example, that corresponds to bit locations 4, 6, 8, and 10 being selected and arranged in the order bit locations 4, 10, 6, and 8 since those bit locations have LLR magnitudes of 0, 1, 2, and 2, respectively. In some embodiments, the selected bit locations are sorted according to reliability because the Chase decoding process stops if an acceptable result is found and sorting may help in keeping the number of decoding attempts down.

A sliding window of length m is then applied to the selected and sorted m' bit locations. Diagram 1502 shows the sliding window at T1 (i.e., a first sliding window iteration), where bit locations 4 and 10 are selected. Chase decoding is performed on bit locations 4 and 10 and 4 decoding attempts are performed at T1. Diagram 1504 shows the sliding window at T2 (i.e., a second sliding window iteration), where bit locations 10 and 6 are selected. This corresponds to another 4 decoding attempts. Diagram 1506 shows the sliding window at T3 (i.e., a third sliding window iteration), where bit locations 6 and 8 are selected. This corresponds to another 4 decoding attempts.

With this sliding window technique, at most, (m'−m+1)× ($2^m$) decoding attempts are performed. In contrast, a traditional Chase decoding approach would require $2^{m'}$ decoding attempts. For m'=4 and m=2, this corresponds to 12 attempts instead of 16 attempts. Naturally, as the value of m' increases, the savings improves.

In various embodiments, the sliding window technique stops under a variety of conditions. In one example, Chase decoding stops when a first acceptable result is found. For example, there may be some miscorrection detection technique which tests Chase decoding results for miscorrections. The first non-miscorrection identified by the miscorrection detector is accepted and the Chase decoder stops. In some other embodiments, the sliding window technique goes through from beginning to end (e.g., through diagram 1502,

1504, and 1506) and selects the best Chase decoding result. For example, a miscorrection detector may be used to select the Chase decoding result which is believed to be the least likely miscorrection and/or some mostly likely or most probable Chase decoding result is selected.

Returning to FIG. 1, in some embodiments, the sliding window technique is used at step 104 and/or 110.

The algorithms described above (such as those described in U.S. Pat. No. 9,231,623 entitled "CHASE DECODING FOR TURBO PRODUCT CODES USING ERROR INTERSECTIONS", the contents of which are incorporated by reference herein) use Chase-L (e.g., Chase-m) decoding for decoding row and column constituent codes, where L is the number of the least reliable bits/bit locations used for flipping. The performance gain increases with larger values of L. However, the complexity of Chase decoding increases exponentially with L that may result in this performance optimization being expensive in the hardware implementation. Thus, additional aspects of the invention improve performance in soft decoding without increasing complexity in the hardware.

For the turbo product code constructions disclosed herein, BCH codes are used for constituent codes, however, the invention is not limited to such codes. The invention may be implemented with other codes and may be applied to any soft decoding algorithm for any class of codes which used list decoding methods like Chase during decoding.

Figure 16:
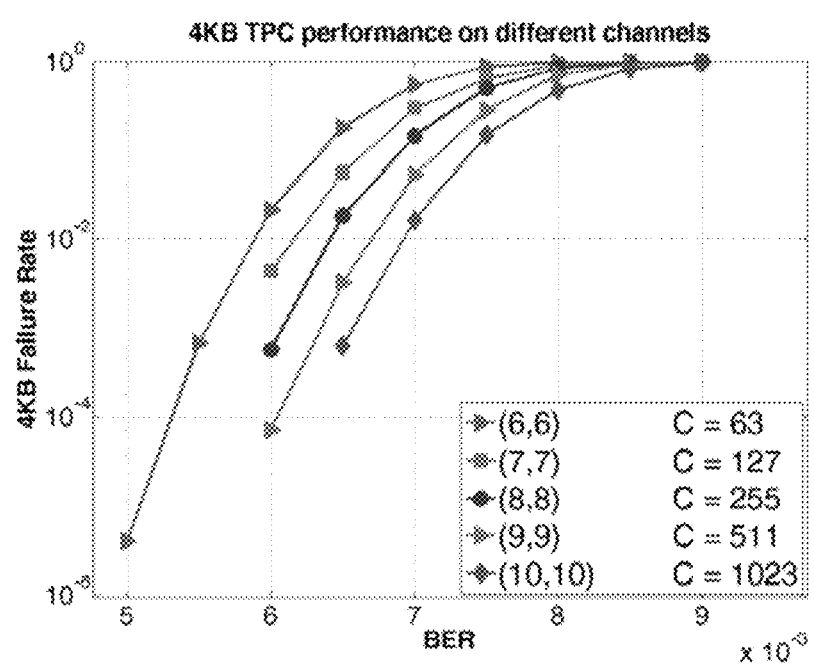
FIGS. 16, 17, 18 and 19 are graphs showing system performance.

In examples of Chase-L decoding, soft information is used to find L least reliable bits (e.g., selecting with a bit location selector a set of least reliable bit locations) in the constituent codeword. These least reliable bits are used to form all possible $2^L-1$ error patterns. These possible error patterns are used to flip bits in the received hard decision constituent codeword and a list of successful BCH codewords is formed after decoding flipped received constituent codeword using a BCH decoder. In the list of successfully decoded codewords, a maximum likelihood codeword is selected which has minimum Euclidean distance from the received soft decision constituent codeword. In FIG. 16, a graph 1600 shows diminishing performance effect is shown with increasing values of L. In order to get better performance gains, increasing value of L is not a good solution because it increases the complexity of the decoding and provides diminishing performance gains with increasing values of L.

An additional method of achieving better performance gains without adding much decoding complexity is disclosed herein. It may include a modified version of Chase decoding, referred to herein as Chase-(L,S), where the decoding is based on (e.g., limited to or constrained to, bound to, etc.) L (e.g., a first value) as the number of least reliable bits in a set of bits/bit locations, and S (e.g., a second value) as the maximum number of allowable flips allowed out of L possible error locations. Thus, the total number of BCH decoding will be less than $2^L-1$ and is given as:

$$C_{chase} = \Sigma_{k=0}^{S}\binom{L}{k}$$

Figure 17:
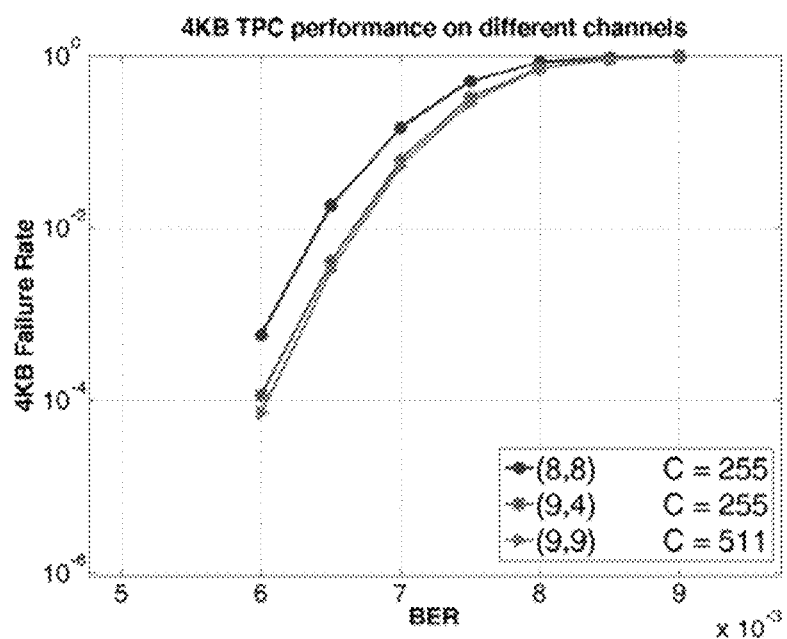

The modified Chase decoding may provide the correct codeword as long as the number of erroneous bits do not exceed the correction capability of the code by more than S (e.g., is less than S+ correction capability), and, at least S erroneous bits appear in the L least reliable bits (e.g., the number of erroneous bits in the least reliable bits is at least equal to the second value). The graph 1700 of FIG. 17 shows performance for regular Chase (9,9) achieved by running a Chase-(9,4) (e.g., L=9 and S=4), which has much less complexity than Chase-(9,9).

Figure 18:
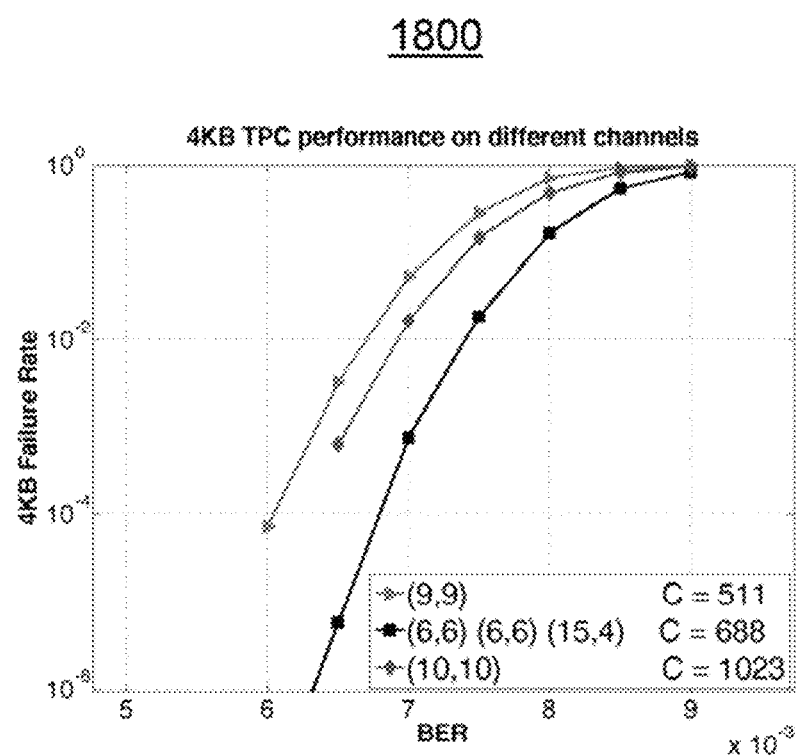

The decoder for product codes may be iterative and Chase parameters depending upon the channel can be modified accordingly at different iterations. These parameters may be optimized for additive white Gaussian channel (AWGN). The graph 1800 in FIG. 18 shows performance where Chase-(6,6) is used at the first two iterations and Chase-(15, 4) is used at a third iteration and this decoding is performed iteratively until the codeword is successfully decoded or number of iteration doesn't reach the maximum allowable iterations. Note here that the complexity of the proposed iterative decoding is smaller than regular Chase-(10,10) but the performance gain is significant. The invention disclosed herein works because it tries to break error patterns which have a few errors present in the first 15 least reliable locations such that those errors are not present in the first 10 least reliable locations. In general, these parameters for modified Chase decoding can be determined through simulation depending upon the desired channel.

Thus, the Chase decoder may be configured to decode at iterations, including an initial iteration and a subsequent iteration. It may be determined to utilize a value of L and a value of S during initial iterations and changing the values of L and S at subsequent iterations. For example, L may be increased at subsequent iterations and/or S may be decreased at subsequent iterations (or vice versa).

A Chase miscorrection avoidance algorithm may be used in soft decoding that can reduce the miscorrection for constituent codes. This miscorrection avoidance algorithm is based on a miscorrection avoidance threshold value. There is a tradeoff in performance with this miscorrection avoidance threshold value. If a lower value of threshold value is used in decoding, it can avoid all miscorrections but it would not allow correcting some codewords which are decoded correctly but doesn't satisfy the threshold check. If a higher value of threshold value is used in decoding, it will allow correctly decoded codewords but will add miscorrections that is not desirable.

Figure 19:
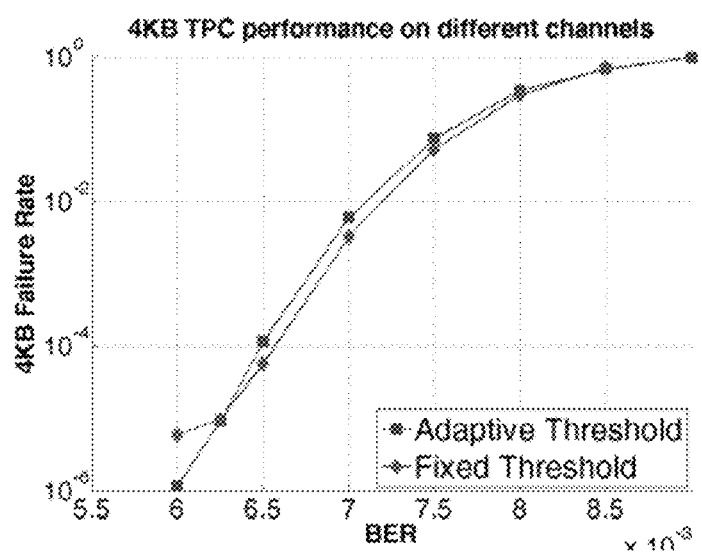

Thus, a lower value of threshold may be in the early decoding iterations and as the decoding progresses a higher value of threshold can be used. This adaptive thresholding method provides gains in the higher SNR regime as shown in the graph 1900 of FIG. 19 but the values of adaptive thresholds should be determined according to the desired channel.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for performing turbo product code (TPC) decoding, comprising:
   a memory device:
   a processor; and
   a non-transitory computer readable storage medium coupled to the processor, embedding computer program products executed by the processor, including computer instructions configured to:
   control the memory device including
   a solid state storage, and
   a read controller coupled with the solid state storage, wherein the read controller comprises:
   an error intersection identifier configured to:
   determine a set of one or more error intersections using a set of error-containing codewords, and update, based at least in part on Chase decoding performed on the set of error-containing codewords, the set of one or more error intersections to obtain an updated set of one or more error intersections, wherein the Chase decoding is decoding upon combinatorically flipping certain least reliable bits;

a bit location selector configured to:
select from the set of one or more error intersections, a set of one or more least reliable bit locations using soft information associated with the set of error-containing codewords; and a decoder configured to:
perform the Chase decoding on the set of error-containing codewords based on a first value being a number of least reliable bit locations and a second value being a maximum number of allowable flips allowed out of the number of least reliable bit locations.

2. The system of claim 1, wherein a number of erroneous bits in the set of least reliable bit locations is less than a correction capability of the system plus the second value.

3. The system of claim 2, wherein the number of erroneous bits is at least equal to the second value.

4. The system of claim 1, wherein the Chase decoder performs the Chase decoding in at least an initial iteration and a subsequent iteration.

5. The system of claim 4, wherein the first value is increased at the subsequent iteration.

6. The system of claim 4, wherein the second value is decreased at the subsequent iteration.

7. A method for performing turbo product code (TPC) decoding in a memory device including an error intersection identifier, a bit location selector and a decoder, comprising:
determining, with the error intersection identifier, a set of one or more error intersections using a set of error-containing codewords;
updating, with the error intersection identifier, the set of one or more error intersections based at least in part on Chase decoding performed on the set of error-containing codewords to obtain an updated set of one or more error intersections, wherein the Chase decoding is decoding upon combinatorically flipping certain least reliable bits;
selecting, with the bit location selector, from the set of error intersections, a set of one or more least reliable bit locations using soft information associated with the set of error-containing codewords; and
performing the Chase decoding, with the decoder, on the set of error-containing codewords based on a first value being a number of least reliable bit locations and a second value being a maximum number of allowable flips allowed out of the number of least reliable bit locations.

8. The method of claim 7, wherein a number of erroneous bits in the set of least reliable bit locations is less than a correction capability plus the second value.

9. The method of claim 8, wherein the number of erroneous bits is at least equal to the second value.

10. The method of claim 7, wherein the decoder performs the Chase decoding in at least an initial iteration and a subsequent iteration.

11. The method of claim 10, wherein the first value is increased at the subsequent iteration.

12. The method of claim 10, wherein the second value is decreased at the subsequent iteration.

13. A memory device for performing turbo product code (TPC) decoding, comprising:
a solid state storage; and
a read controller coupled with the solid state storage, wherein the read controller comprises:
an error intersection identifier configured to:
determine a set of one or more error intersections using a set of error-containing codewords; and
update, based at least in part on Chase decoding performed on the set of error-containing codewords, the set of one or more error intersections to obtain an updated set of one or more error intersections, wherein the Chase decoding is decoding upon combinatorically flipping certain least reliable bits;
a bit location selector configured to:
select, from the set of one or more error intersections, a set of one or more least reliable bit locations using soft information associated with the set of error-containing codewords; and
a decoder configured to:
perform the Chase decoding on the set of error-containing codewords based on a first value being a number of least reliable bit locations and a second value being a maximum number of allowable flips allowed out of the number of least reliable bit locations.

14. The memory device of claim 13, wherein a number of erroneous bits in the set of least reliable bit locations is less than a correction capability of the memory device plus the second value.

15. The memory device of claim 14, wherein the number of erroneous bits is at least equal to the second value.

16. The memory device of claim 13, wherein the Chase decoder performs the Chase decoding in at least an initial iteration and a subsequent iteration.

17. The memory device of claim 16, wherein the first value is increased at the subsequent iteration.

18. The memory device of claim 16, wherein the second value is decreased at the subsequent iteration.

* * * * *